(12) United States Patent
Kim et al.

(10) Patent No.: US 9,130,011 B2
(45) Date of Patent: Sep. 8, 2015

(54) APPARATUS FOR MOUNTING SEMICONDUCTOR DEVICE

(75) Inventors: Taehyun Kim, Cheonan-si (KR); Dongsoo Lee, Cheonan-si (KR); Seok Goh, Cheonan-si (KR); Kyoungbok Cho, Cheonan-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 1189 days.

(21) Appl. No.: 13/071,640

(22) Filed: Mar. 25, 2011

(65) Prior Publication Data
US 2011/0232082 A1 Sep. 29, 2011

(30) Foreign Application Priority Data
Mar. 26, 2010 (KR) .................... 10-2010-0027451

(51) Int. Cl.
*H01L 21/67* (2006.01)
*H05K 13/04* (2006.01)
*H01L 23/00* (2006.01)
(Continued)

(52) U.S. Cl.
CPC .......... *H01L 24/75* (2013.01); *H01L 21/67144* (2013.01); *H05K 13/046* (2013.01); *H01L 21/6836* (2013.01); *H01L 24/13* (2013.01); *H01L 24/16* (2013.01); *H01L 24/81* (2013.01); *H01L 24/95* (2013.01); *H01L 2221/68336* (2013.01); *H01L 2221/68381* (2013.01); *H01L 2224/131* (2013.01); *H01L 2224/7501* (2013.01); *H01L 2224/759* (2013.01); *H01L 2224/7565* (2013.01); *H01L 2224/7598* (2013.01); *H01L 2224/75251* (2013.01); *H01L 2224/75651* (2013.01); *H01L 2224/75744* (2013.01); *H01L 2224/75745* (2013.01); *H01L 2224/75801* (2013.01); *H01L 2224/75821* (2013.01); *H01L 2224/81011* (2013.01); *H01L 2224/81191* (2013.01); *H01L 2224/81815* (2013.01); *H01L 2924/014* (2013.01); *H01L 2924/01005* (2013.01); *H01L 2924/01006* (2013.01); *H01L 2924/01033* (2013.01); *H01L 2924/01047* (2013.01); *H01L 2924/01051* (2013.01); *H01L 2924/01074* (2013.01); *H05K 1/0269* (2013.01); *Y10T 29/53178* (2015.01)

(58) Field of Classification Search
CPC ... H05K 13/04; H05K 13/048; H05K 13/046; H05K 13/043; H05K 13/0434; H05K 13/0478; H05K 13/0061; H05K 13/0069; H01L 21/67144; H01L 24/75; Y10T 29/53178
See application file for complete search history.

(56) References Cited

U.S. PATENT DOCUMENTS 4,725,182 A * 2/1988 Sakamoto et al. ....... 414/331.02
6,863,109 B2 * 3/2005 Kim et al. ..................... 156/556
(Continued)

FOREIGN PATENT DOCUMENTS

JP 2002-198692 7/2002
JP 2004-023100 1/2004
(Continued)

*Primary Examiner* — Livius R Cazan
(74) *Attorney, Agent, or Firm* — F. Chau & Associates, LLC

(57) ABSTRACT

An apparatus for mounting a semiconductor device includes a mounting component and a loading component. The mounting component is configured to mount the semiconductor device onto a circuit board. The loading component is disposed adjacent to the mounting component, and is configured to supply the semiconductor device and the circuit board to the mounting component.

16 Claims, 9 Drawing Sheets

(51) Int. Cl.
*H01L 21/683* (2006.01)
*H05K 1/02* (2006.01)

(56) References Cited

U.S. PATENT DOCUMENTS 6,944,943 B2 9/2005 Cho et al.
7,036,213 B2 5/2006 Kabeshita et al.
2002/0062554 A1\* 5/2002 Hwang et al. ............... 29/832
2002/0062555 A1 5/2002 Hwang et al.
2008/0221723 A1\* 9/2008 Lee .............................. 700/112

FOREIGN PATENT DOCUMENTS

KR 1020020040414 5/2002
KR 1020030023764 3/2003
KR 1020030095573 12/2003

\* cited by examiner

APPARATUS FOR MOUNTING SEMICONDUCTOR DEVICE

CROSS-REFERENCE TO RELATED APPLICATION

This U.S. non-provisional patent application claims priority under 35 U.S.C. §119 to Korean Patent Application No. 10-2010-0027451 filed on Mar. 26, 2010, the disclosure of which is incorporated by reference herein in its entirety.

BACKGROUND

1. Technical Field

The present disclosure relates to an apparatus for mounting a semiconductor device, and more particularly, to an apparatus for surface mounting a semiconductor device on a circuit board.

2. Discussion of the Related Art

As the speed and integration of semiconductor devices increase, semiconductor devices become smaller in size and have an increased number of input and output pins. Flip chip bonding technology may be utilized to surface mount semiconductor devices to circuit boards. Flip chip bonding includes directly mounting a semiconductor device on a mounting unit on a circuit board using a bump formed of a conductive material. Flip chip bonding results in high speed, high integration, and miniaturization of semiconductor devices during the mounting process when compared to other types of bonding technologies, such as wire bonding and tape automated bonding (TAB) using a tape circuit board.

Therefore, a need exists for an improved apparatus for surface mounting a semiconductor device on a circuit board.

SUMMARY

According to an exemplary embodiment of the present inventive concept, an apparatus for mounting a semiconductor device includes a mounting component and a loading component. The mounting component is configured to mount the semiconductor device onto a circuit board. The loading component is disposed adjacent to the mounting component, and is configured to supply the semiconductor device and the circuit board to the mounting component.

According to an exemplary embodiment of the present inventive concept, an apparatus for mounting a semiconductor device includes a mounting component configured to mount the semiconductor device onto a circuit board, and a loading component disposed adjacent to the mounting component along a first direction, configured to supply the semiconductor device and the circuit board to the mounting component. The loading component includes first and second semiconductor device supply units, a circuit board loading unit, and a circuit board supply unit. The first and second semiconductor device supply units are disposed along a second direction, substantially perpendicular to the first direction, are spaced apart from each other, and are configured to supply the semiconductor device to the mounting component. The circuit board loading unit is disposed between the first and second semiconductor device supply units, and is configured to load the circuit board into the loading component. The circuit board supply unit is disposed between the first and second semiconductor device supply units and adjacent to the circuit board loading, and is configured to supply the circuit board to the mounting component.

According to an exemplary embodiment of the present inventive concept, a mounting component for a semiconductor mounting apparatus includes first and second horizontal guide rails, first and second vertical guide rails, first and second head assemblies, first and second circuit board transfer rails, and first and second semiconductor device transfer units. The first and second horizontal guide rails are spaced apart from each other and disposed in a first direction. The first and second vertical guide rails are spaced apart from each other and disposed in a second direction, substantially perpendicular to the first direction. The first and second head assemblies are configured to pick up and mount a semiconductor device on a circuit board, to move in the first direction along the first and second horizontal guide rails, and to move in the second direction along the first and second vertical guide rails. The first and second circuit board transfer rails are configured to receive the circuit board from a loading component and move the circuit board in the first direction, and are substantially parallel to each other and disposed in the first direction between the first and second horizontal guide rails. The first and second semiconductor device transfer units are configured to receive the semiconductor device from a loading component and move the semiconductor device in the first direction. The first semiconductor device transfer rail is disposed in the first direction between the first horizontal guide rail and the first circuit board transfer rail. The second semiconductor device transfer unit is disposed in the first direction between the second horizontal guide rail and the second circuit board transfer rail.

According to an exemplary embodiment of the present inventive concept, a loading component for a semiconductor mounting apparatus includes first and second semiconductor device supply units spaced apart from each other, a circuit board loading unit, and a circuit board supply unit. The circuit board loading unit is configured to load a circuit board into the loading component, and is disposed between the first and second semiconductor device supply units. The circuit board supply unit is configured to supply the circuit board to the mounting component, and is disposed adjacent to the circuit board loading unit and between the first and second semiconductor device supply units.

BRIEF DESCRIPTION OF THE DRAWINGS

The above and other features of the present invention will become more apparent by describing in detail exemplary embodiments thereof with reference to the accompanying drawings in which.

DETAILED DESCRIPTION OF THE EXEMPLARY EMBODIMENTS

Figure 1:
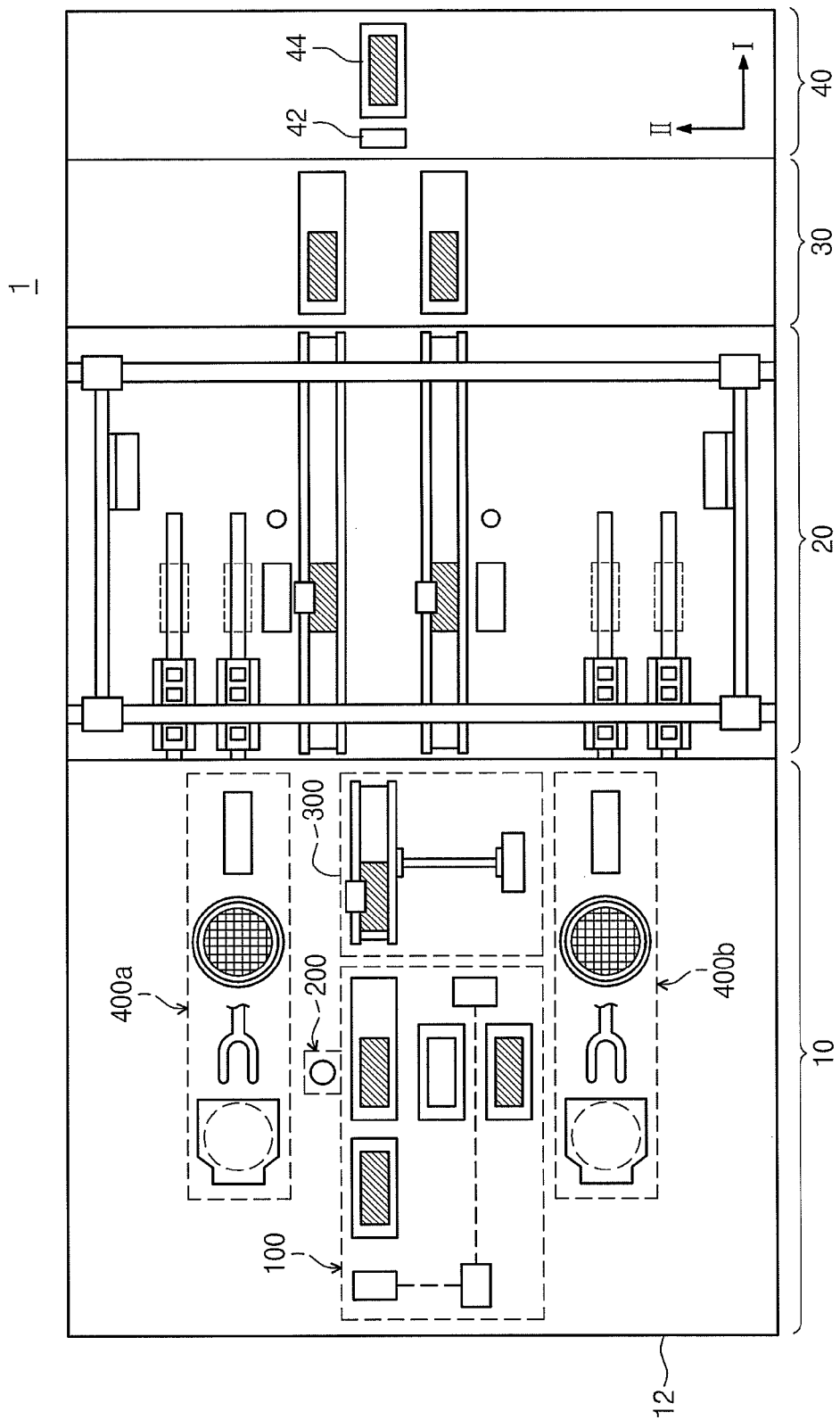
FIG. 1 is a view of an apparatus for mounting a semiconductor device according to an exemplary embodiment of the inventive concept.

Exemplary embodiments of the present inventive concept will be described more fully hereinafter with reference to the accompanying drawings. Like reference numerals refer to like elements throughout the accompanying drawings.

FIG. 1 is a view illustrating an apparatus 1 for mounting a semiconductor device according to an exemplary embodiment of the present inventive concept. Referring to FIG. 1, the apparatus 1 for mounting the semiconductor device includes a loading component 10, a mounting component 20, a reflowing component 30, and an unloading component 40. The loading component 10, the mounting component 20, the reflowing component 30, and the unloading component 40 may be disposed substantially in a line along a first direction I.

The loading component 10 is disposed adjacent to a front side of the mounting component 20 along the first direction I, and supplies semiconductor devices and circuit boards to the mounting component 20. The semiconductor device may include a flip chip having a solder bump, and the circuit board may be a printed circuit board (PCB) including connection pads and circuit wirings. The mounting component 20 surface mounts the semiconductor device on the circuit board. The reflowing component 30 is disposed adjacent to a rear side of the mounting component 20 along the first direction I, and performs reflow soldering, thereby coupling the solder bump of the semiconductor device to the connection pad of the circuit board. The unloading component 40 is disposed adjacent to a rear side of the reflowing component 30 along the first direction I, and unloads the circuit board once the semiconductor device has been coupled to the circuit board.

The loading component 10 includes a circuit board loading unit 100, a detector 200, a circuit board supply unit 300, and first and second semiconductor device supply units 400a and 400b. The circuit board loading unit 100 and the circuit board supply unit 300 may be disposed substantially in a line along the first direction I in a central region of a housing 12. The circuit board loading unit 100 loads the circuit board. The circuit board supply unit 300 is disposed adjacent to a rear side of the circuit board loading unit 100, receives the circuit board from the circuit board loading unit 100, and supplies the circuit board to the mounting component 20. The detector 200 is disposed near a side of the circuit board loading unit 100, and reads a reject mark on the circuit board loaded onto the circuit board loading unit 100. A reject mark is a mark indicating whether a defect is present on the circuit board in the region where the semiconductor device will be mounted. The first and second semiconductor device supply units 400a and 400b may be respectively disposed on both sides of the circuit board loading unit 100 and the circuit board supply unit 300 along a second direction II. The second direction II is perpendicular to the first direction I. The first and second semiconductor device supply unit 400a and 400b supply the semiconductor device to the mounting component 20.

Figure 2:
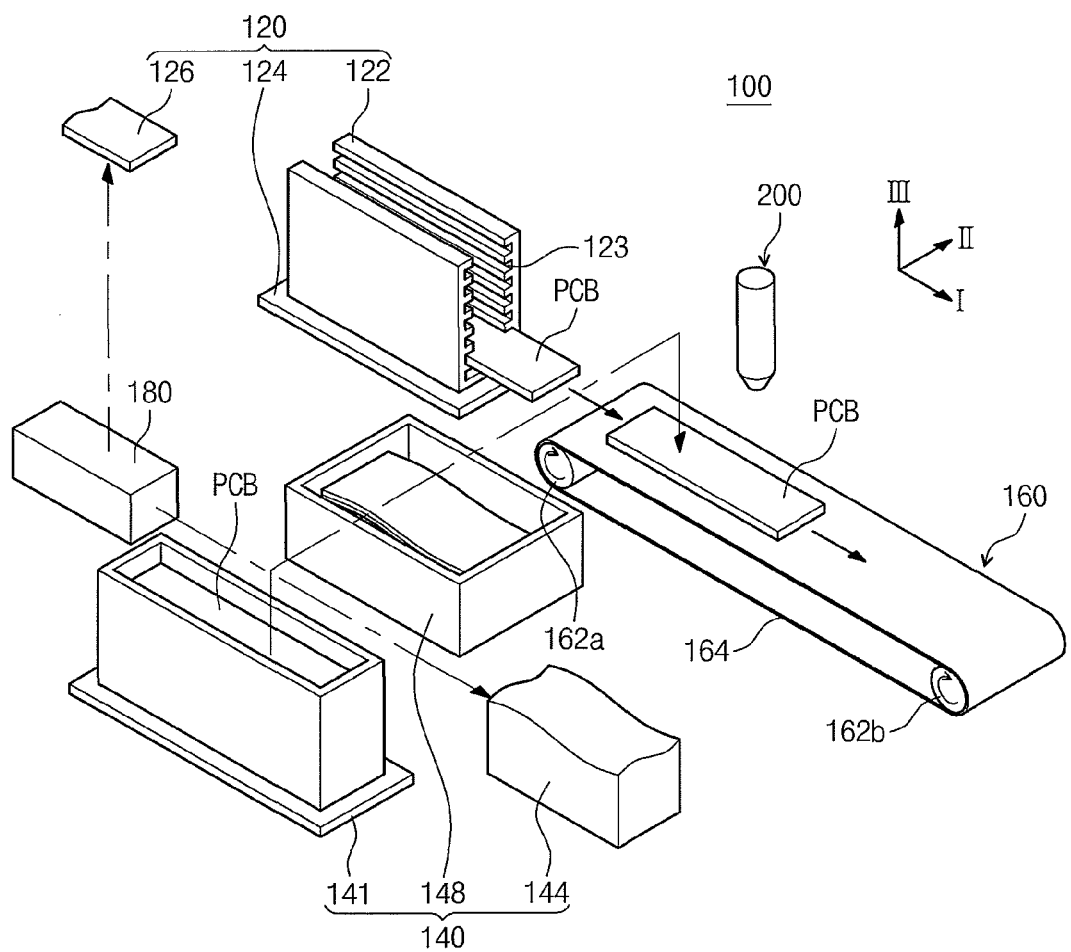
FIG. 2 is a perspective view illustrating a circuit board loading unit of FIG. 1 according to an exemplary embodiment of the inventive concept.
Figure 3:
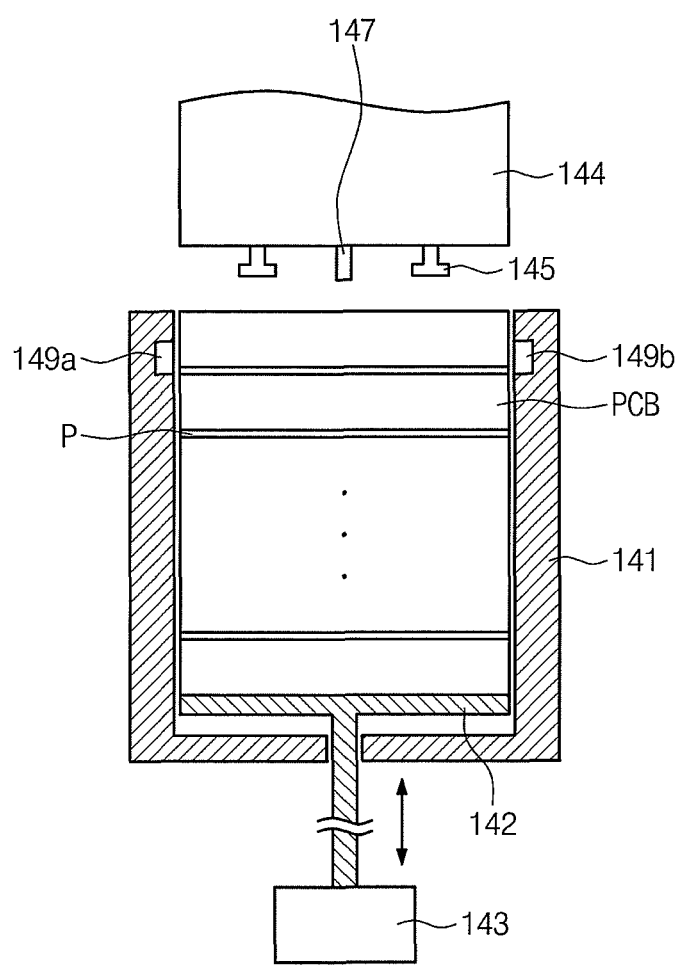
FIG. 3 is a view illustrating a substrate cassette and a second robot of FIG. 2 according to an exemplary embodiment of the inventive concept.

FIG. 2 is a perspective view illustrating the circuit board loading unit 100 of FIG. 1 according to an exemplary embodiment of the present inventive concept. FIG. 3 is a view illustrating a substrate cassette 141 and a second robot 144 of FIG. 2 according to an exemplary embodiment of the present inventive concept. Referring to FIGS. 2 and 3, the circuit board loading unit 100 includes a first loader 120, a second loader 140, a conveyor 160, and a controller 180. The first loader 120 and the second loader 140 load the circuit board PCB and transfer the circuit board PCB to the conveyor 160. The conveyor 160 transfers the circuit board PCB to the circuit board supply unit 300. The controller 180 controls operations of the first loader 120 and the second loader 140.

The first loader 120 loads the circuit board PCB in a magazine manner, e.g., a manner in which the circuit board PCB is inserted into a slot provided in a magazine. For example, the first loader 120 includes a magazine 122, a lift table 124, and a first robot 126. The magazine 122 may have a box shape in which front and rear sides are disposed substantially along a first direction I, and an opening is disposed on an upper side thereof. Slots 123 receiving the circuit board PCB are disposed in the magazine 122 substantially along a third direction III. The circuit boards loaded into the magazine 122 may require a baking process to remove moisture. The circuit boards are individually received into the slots 123 of the magazine 122. In FIG. 2, the third direction III is substantially perpendicular to the first direction I and the second direction II.

The magazine 122 may be mounted on the lift table 124, and the lift table 124 may be moved in an upward or downward direction by a driving unit (not shown). The first robot 126 is disposed at a front side of the magazine 122, and pushes the circuit board PCB received into the magazine 122 to a rear side, thereby ejecting the circuit board PCB. Once the circuit board PCB disposed in a slot 123 at a first height within the magazine 122 is ejected by the first robot 126, the driving unit moves the magazine 122 upward and the first robot 126 ejects a circuit board PCB disposed in a slot 123 at a second height (e.g., below the first height) within the magazine 122.

The second loader 140 loads the circuit board PCB in a single wafer manner, e.g., a manner in which a plurality of stacked circuit boards PCB is loaded on a substrate cassette. The second loader 140 includes a substrate cassette 141, a second robot 144, and an interleaving paper recovery box 148. The substrate cassette 141 may have a cylindrical shape with an opening on an upper side, and is disposed at a side of the conveyor 160. A support plate 142 is disposed within the substrate cassette 141. The support plate 142 is moved in an upward or downward direction by a driving member 143. The circuit boards PCB are stacked on the support plate 142 in the third direction III, and thus are received into the substrate cassette 141. The circuit boards stacked on the support plate 142 of the substrate cassette 141 may not require a baking process. An interleaving paper P is disposed between the circuit boards PCB.

An absorption member 145 and a conductive member 147 are disposed on a lower end of the second robot 144. The absorption member 145 vacuum-absorbs the interleaving paper P and the circuit board PCB. The conductive member 147 detects whether current is flowing through the circuit board PCB and the interleaving paper P. When current is flowing, the absorption member 145 determines that the circuit board PCB is vacuum-absorbed, and the second robot 144 transfers the circuit board PCB to the conveyor 160. When current is not flowing, the absorption member 145 determines that the interleaving paper P is vacuum-absorbed, and the second robot 144 places the interleaving paper P into the interleaving paper recovery box 148 disposed between the substrate cassette 141 and the conveyor 160.

Optical sensors 149a and 149b are disposed in the substrate cassette 141. The optical sensors 149a and 149b include a light emitting component 149a and a light receiving component 149b. The light emitting component 149a and the light receiving component 149b are disposed at opened, upper portions of the substrate cassette 141 and face each other. The light emitting component 149a and the light receiving component 149b detect whether a circuit board PCB is loaded within the substrate cassette 141. When a circuit board PCB disposed at the uppermost end within the substrate cassette 141 is ejected by the second robot 144, the light receiving component 149b receives an optical signal emitted from the light emitting component 149a. This results in the circuit boards PCB within the substrate cassette 141 being moved in an upward direction by the driving member 143. Once a circuit board PCB is moved into the uppermost end within the substrate cassette 141, the light receiving component 149b no longer receives the optical signal emitted from the light emitting component 149a, and the driving member 143 stops moving the circuit boards PCB in an upward direction. The second robot 144 then ejects the circuit board PCB disposed at the uppermost end within the substrate cassette 141. This process is repeated to eject the plurality of circuit boards PCB from the substrate cassette 141. Once there are no circuit boards PCB remaining within the substrate cassette 141, the light receiving component 149b continuously receives the optical signal emitted from the light emitting component 149a. Thus, the optical sensors 149a and 149b may detect when additional circuit boards PCB are loaded into the substrate cassette 141.

The conveyor 160 is disposed adjacent to the rear side of the magazine 122 along the first direction I. The conveyor 160 includes rollers 162a and 162b spaced in parallel from each other in the first direction I, and a conveyor belt 164 wound around the rollers 162a and 162b. The circuit board PCB ejected from the magazine 122 or the substrate cassette 141 is placed on the conveyor belt 164. An upper portion of the conveyor belt 164 is moved in the first direction I by the rotation of the rollers 162a and 162b. Thus, the circuit board placed on the conveyor belt 164 is moved in the first direction I. A circuit board supply unit 300, which is described in more detail below, is disposed at a rear end of the conveyor 160. The circuit board PCB loaded onto the conveyor 160 is transferred to the circuit board supply unit 300.

The controller 180 controls the first robot 126 and the second robot 144, and loads the circuit board PCB using one of the magazine 122 or the substrate cassette 141. Circuit boards that require a baking process for removing moisture are loaded into the magazine 122, and circuit boards that do not require a baking process are loaded into the substrate cassette 141. When the circuit boards requiring the baking process are loaded, the controller 180 operates the first robot 126 to eject the circuit board PCB from the magazine 122. When the circuit boards that do not require the baking process are loaded, the controller 180 operates the second robot 144 to eject the circuit board PCB from the substrate cassette 141.

Figure 4:
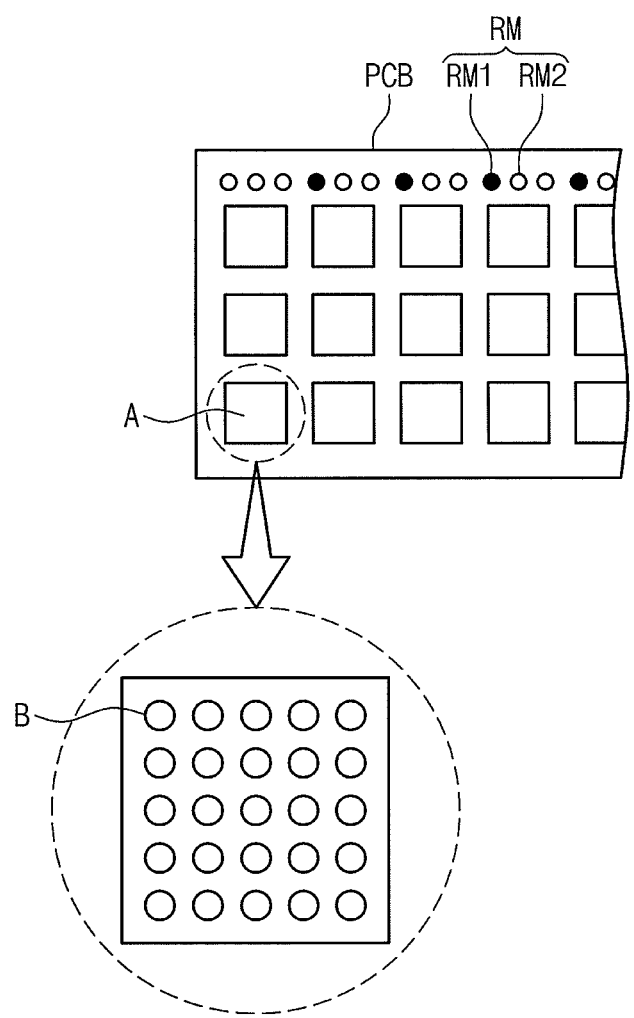
FIG. 4 is a view of a circuit board according to an exemplary embodiment of the inventive concept.

The reject mark detector 200 is disposed above the conveyor 160, and reads the reject marks on the circuit board PCB. As shown in FIG. 4, reject marks RM are disposed substantially in a line in an upper region of the circuit board PCB. A plurality of semiconductor device mounting regions A are disposed on the circuit board PCB below the reject marks RM. A plurality of connection pads B to which the solder bumps of the semiconductor device are coupled are disposed in each of the semiconductor device mounting regions A. The reject marks RM correspond to the semiconductor device mounting regions A. The reject marks indicate whether the corresponding semiconductor device mounting regions A are defective. For example, a first reject mark RM1 having a black color indicates that the corresponding semiconductor device mounting region A is defective, and a second reject mark RM2 having a white color indicates that the corresponding semiconductor device mounting region A is not defective.

The reject mark detector 200 reads the reject marks RM of the circuit board PCB to determine whether the semiconductor device mounting regions A are defective. The results of the reject mark detector 200 are transmitted to the mounting component 20. Based on the result, the mounting component 20 mounts semiconductor devices in mounting regions A that are not defective, and does not mount semiconductor devices in defective semiconductor device mounting regions A.

Figure 5:
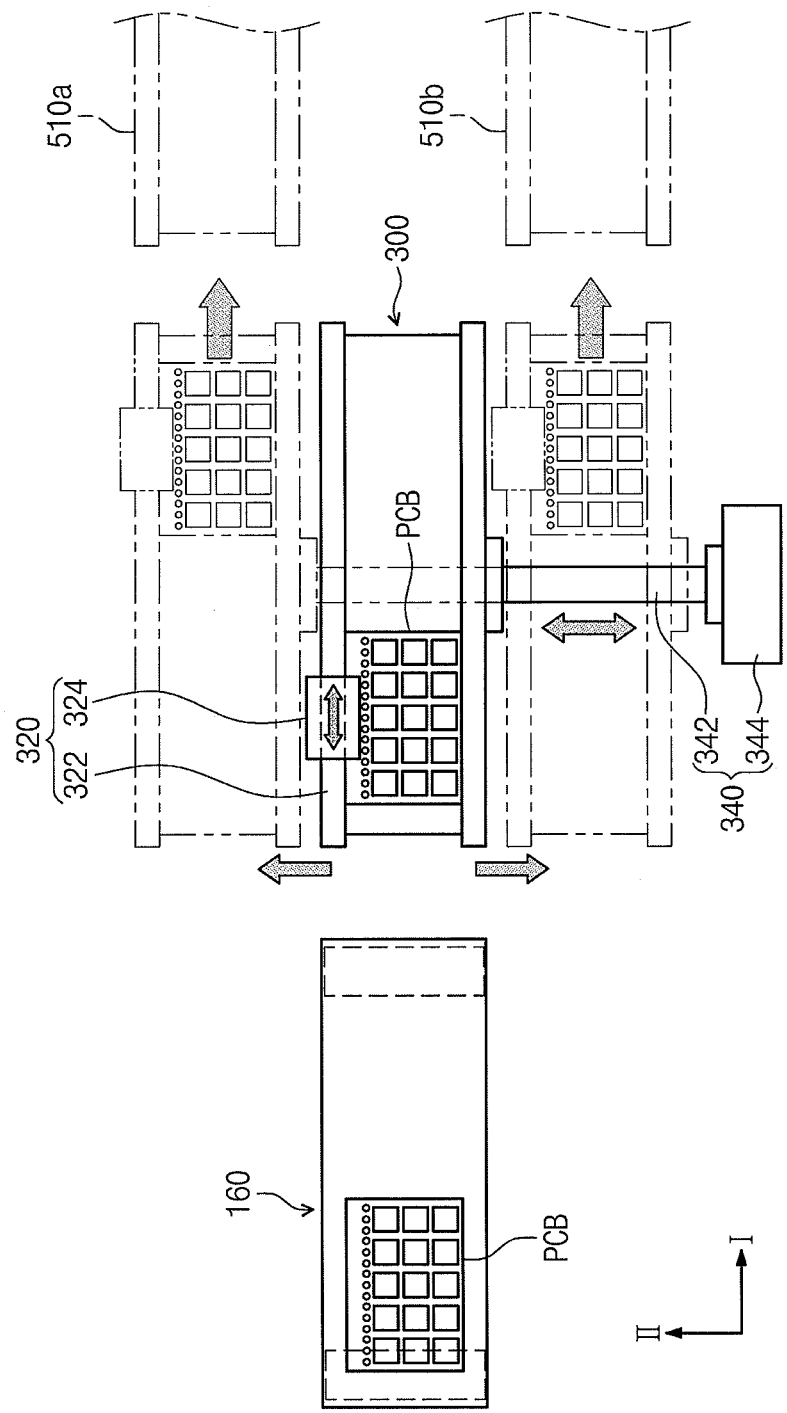
FIG. 5 is a view illustrating a circuit board supply unit of FIG. 1 according to an exemplary embodiment of the inventive concept.

FIG. 5 is a view illustrating a circuit board supply unit of FIG. 1. The circuit board supply unit 300 supplies the circuit board PCB transferred from the conveyor 160 of the circuit board loading unit 100 to the mounting component 20.

Referring to FIG. 5, the circuit board supply unit 300 includes a feeder 320 and a feeder driving member 340. The feeder 320 is disposed adjacent to a rear end of the conveyor 160 along the first direction I. The feeder 320 receives the circuit board PCB transferred by the conveyor 160, and supplies the circuit board PCB to circuit board transfer rails 510a and 510b of the mounting component 20. The feeder 320 includes rails 322 extending parallel to each other in the first direction I. The rails 322 are disposed facing each other and spaced apart from each other at about a distance corresponding to a width of the circuit board PCB. The circuit board PCB transferred by the conveyor 160 is mounted on the rails 322. A transfer gripper 324 is disposed on the rails 322. The transfer gripper 324 moves the circuit board PCB mounted on the rails 322 in the first direction I.

The feeder driving member 340 moves the feeder 320 in the second direction II. The feeder 340 may stop in a plurality of positions. For example, the feeder 340 may stop in a first position corresponding to the conveyor 160 of the circuit board loading unit 100, a second position corresponding to the first circuit board transfer rail 510a of the mounting component 20, and a third position corresponding to the second circuit board transfer rail 510b of the mounting component 20. The feeder driving member 340 includes a driving shaft 342 coupled to the rails 322 of the feeder 320. The driving shaft 342 extends in the second direction II. One end of the driving shaft 342 is coupled to a lateral surface of each of the rails 322, and the other end is connected to a driving source 344 which provides a linear driving force.

When the circuit board PCB is transferred from the conveyor 160 to the feeder 320, the feeder driving member 340 moves the feeder 320 into a position corresponding to one of the circuit board transfer rails 510a and 510b of the mounting component 20. For example, the feeder driving member 340 may first move the feeder 320 into a position corresponding to the first circuit board transfer rail 510a. The transfer gripper 324 of the feeder 320 may then move the circuit board PCB along the rails 322 and supply the circuit board PCB to the first circuit board transfer rail 510a. When another circuit board PCB is transferred from the conveyor 160 to the feeder 320, the feeder driving member 340 may move the feeder 320 into a position corresponding to the second circuit board transfer rail 510b. The transfer gripper 324 of the feeder 320 may then move the circuit board PCB along the rails 322 and supply the circuit board PCB to the second circuit board transfer rail 510b. Thus, the circuit board supply unit 300 may alternately and sequentially supply circuit boards PCBs to the circuit board transfer rails 510a and 510b of the mounting component 20.

Figure 6:
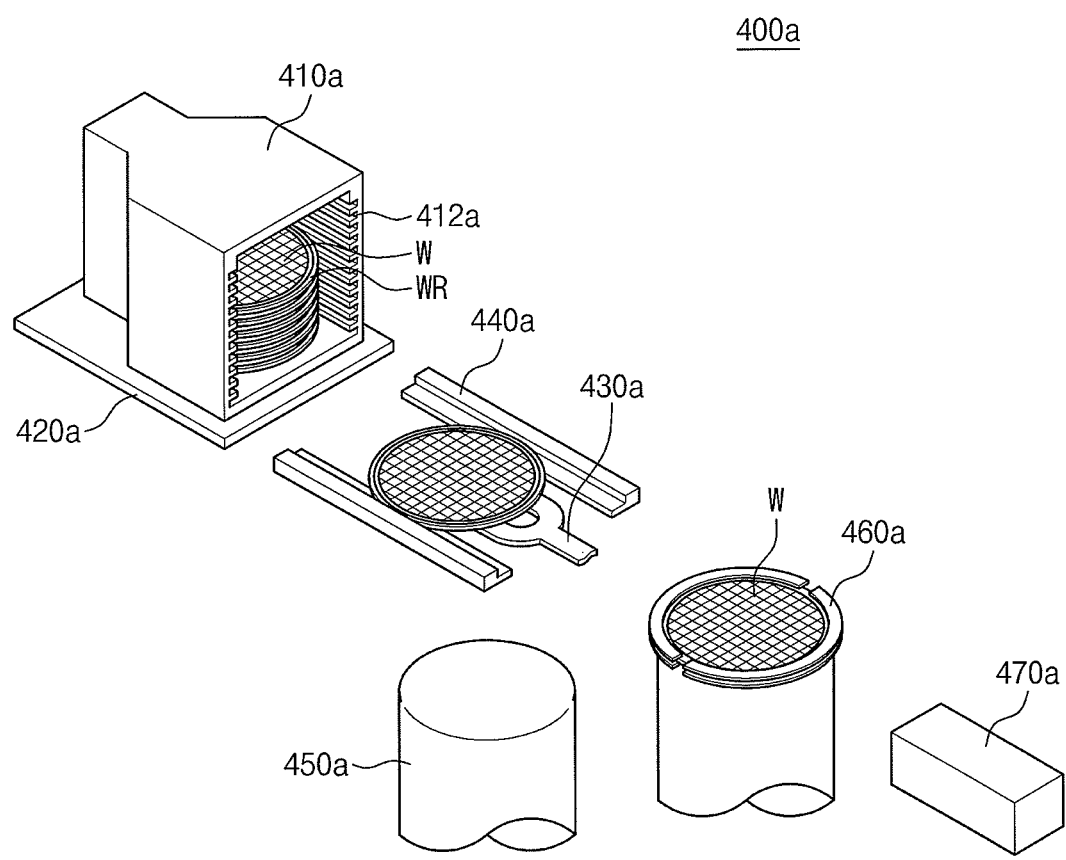
FIG. 6 is a perspective view illustrating a first semiconductor device supply unit of FIG. 1 according to an exemplary embodiment of the inventive concept.

FIG. 6 is a perspective view illustrating the first semiconductor device supply unit 400a of FIG. 1. The first and second semiconductor device supply units 400a and 400b supply the semiconductor devices to the mounting component 20. Since the first semiconductor device supply unit 400a and the second semiconductor device supply unit 400b have a similar configuration, only the first semiconductor device supply unit 400a will be described below.

Figure 7:
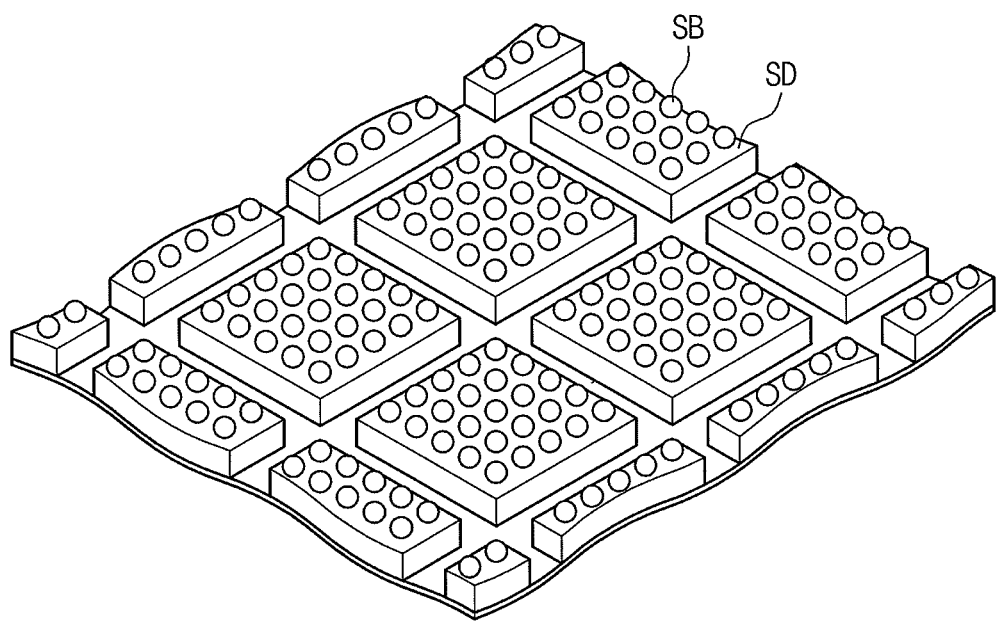
FIG. 7 is a view of semiconductor devices on a wafer separated into individual units according to an exemplary embodiment of the inventive concept.

Referring to FIG. 6, the first semiconductor device supply unit 400a includes a wafer cassette 410a, a first transfer component 430a, a tape expander 460a, and a second transfer component 470a. The wafer cassette 410a is placed on a cassette support 420a. A wafer W is disposed in slots 412a within the wafer cassette 410a. The wafer W received into the slots 412a may be a wafer in which, for example, FAB, back grinding, or a sawing process is performed. An ultraviolet tape, which may be diced, is attached to a back surface of the wafer W, and an edge of the wafer W is supported by a wafer ring WR. As shown in FIG. 7, semiconductor devices SD formed on the wafer W are separated into individual units by the sawing process. A plurality of solder bumps SB is disposed on an active surface of the respective semiconductor devices SD, e.g., on a top surface of the respective semiconductor devices SD.

The first transfer component 430a removes the wafer W from the wafer cassette 410a and places the wafer W on a mounting rail 440a. An ultraviolet irradiation device 450a may be disposed below the mounting rail 440a. The ultraviolet irradiation device 450a irradiates ultraviolet rays onto the ultraviolet tape attached to the back surface of the wafer W, thus dicing the tape and weakening an adhesion force of the tape.

The tape expander 460a is disposed at a side of the mounting rail 440a. The wafer W is placed on the mounting rail 440a and is transferred to the tape expander 460a by the first transfer component 430a. The tape expander 460a pulls the wafer ring WR, thus expanding the ultraviolet tape for dicing, and allowing the semiconductor devices SD on the wafer W to be picked up by the second transfer component 470a.

The second transfer component 470a picks up the semiconductor devices SD, which are separated into individual units on the wafer W, places them on the tape expander 460a, and flips them over, causing the solder bump SB to face downward, thereby supplying the semiconductor devices SD to the mounting component 20.

Figure 8:
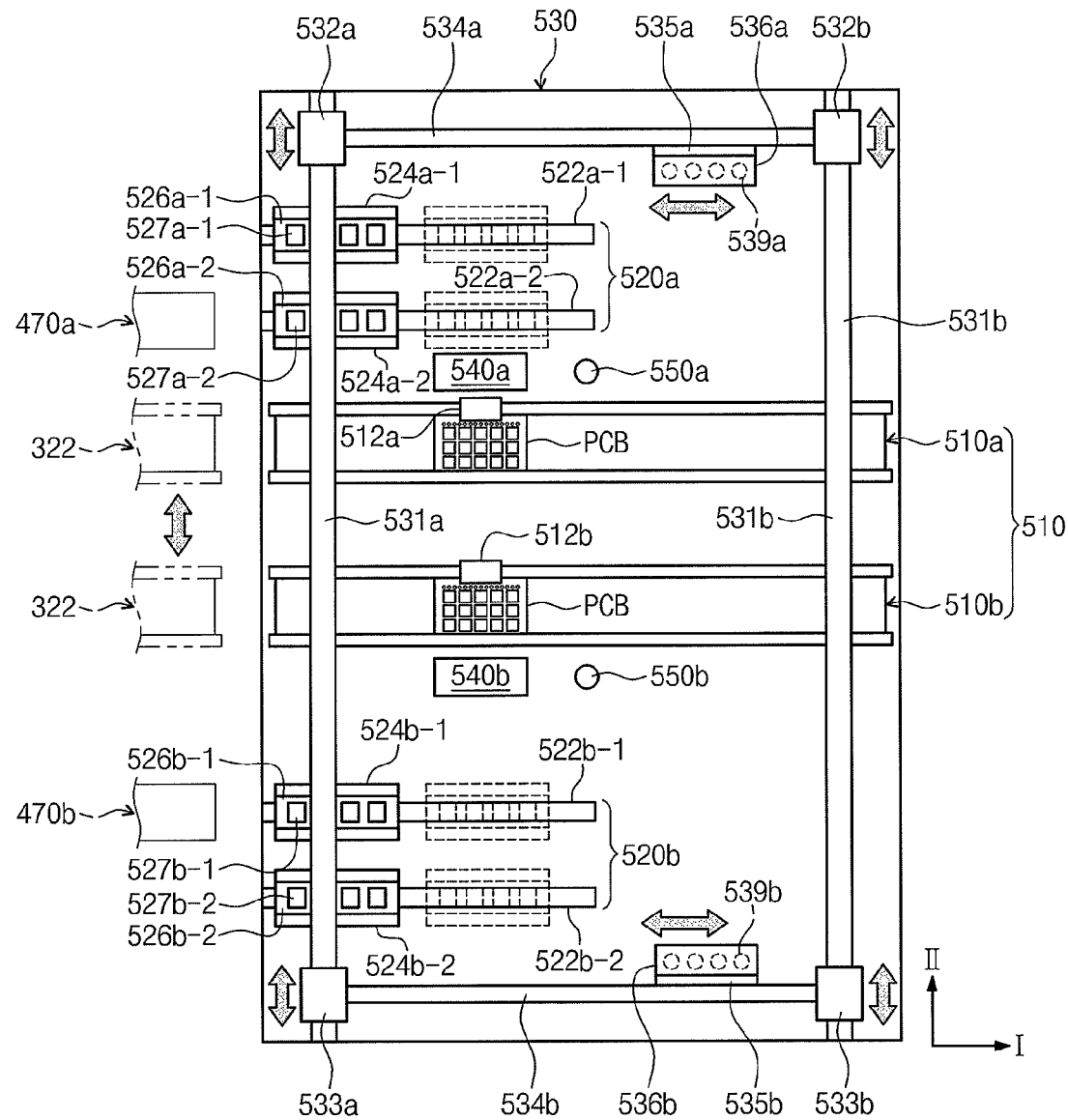
FIG. 8 is a view illustrating a mounting component of FIG. 1 according to an exemplary embodiment of the inventive concept.

FIG. 8 is a view illustrating the mounting component 20 of FIG. 1. Referring to FIG. 8, the mounting component 20 includes a circuit board transfer rail 510, a semiconductor device transfer unit 520, a head unit 530, flux baths 540a and 540b, and optical detection members 550a and 550b.

The circuit board transfer rail 510 includes the first circuit board transfer rail 510a and the second circuit board transfer rail 510b. The first and second circuit board transfer rails 510a and 510b extend in the first direction I, and are disposed substantially parallel to each other along the second direction II in a central region of the mounting component 20. The circuit boards PCB supplied from the rails 322 of the circuit board supply unit 300 are mounted on the first and second circuit board transfer rails 510a and 510b. A first transfer gripper 512a is disposed on the first circuit board transfer rail 510a. The first transfer gripper 512a moves the circuit board PCB mounted on the first circuit board transfer rail 510a in the first direction I. A second transfer gripper 512b is disposed on the second circuit board transfer rail 510b. The second transfer gripper 512b moves the circuit board PCB mounted on the second circuit board transfer rail 510b in the first direction I.

The semiconductor device transfer unit 520 includes a first semiconductor device transfer unit 520a and a second semiconductor device transfer unit 520b. The first and second semiconductor device transfer units 520a and 520b may be symmetrically disposed on both sides of the circuit board transfer rail 510, substantially along the second direction II. The first semiconductor device transfer unit 520a is disposed at a position corresponding to that of the first semiconductor device supply unit 400a of the loading component 10. The first semiconductor device transfer unit 520a receives the semiconductor device from the first semiconductor device supply unit 400a, and moves the semiconductor device in the first direction I. The second semiconductor device transfer unit 520b is disposed at a position corresponding to that of the second semiconductor device supply unit 400b. The second semiconductor device transfer unit 520b receives the semiconductor device from the second semiconductor device supply unit 400b, and moves the semiconductor device in the first direction I.

The first semiconductor device transfer unit 520a includes guide members 522a-1 and 522a-2, linear driving members 524a-1 and 524a-2, and trays 526a-1 and 526a-2. The guide members 522a-1 and 522a-2 extend in the first direction I, and are disposed substantially parallel to each other along the second direction II. The linear driving members 524a-1 and 524a-2 are disposed linearly, and are movable along the guide members 522a-1 and 522a-2. The trays 526a-1 and 526a-2 are disposed on the linear driving members 524a-1 and 524a-2. A plurality of receiving grooves 527a-1 and 527a-2 are defined in the trays 526a-1 and 526a-2. The receiving grooves 527a-1 and 527a-2 receive the semiconductor devices transferred from the second transfer component 470a of the first semiconductor device supply unit 400a.

The second semiconductor device transfer unit 520b includes guide members 522b-1 and 522b-2, linear driving members 524b-1 and 524b-2, and trays 526b-1 and 526b-2. Receiving grooves 527b-1 and 527b-2 are defined in the trays 526b-1 and 526b-2. The receiving grooves 527b-1 and 527b-2 receive the semiconductor devices transferred from the second transfer component 470b of the second semiconductor device supply unit 400b. Since the second semiconductor device transfer unit 520b has a similar construction as that of the first semiconductor device transfer unit 520a, a detailed description of the second semiconductor transfer unit 520b is omitted.

The head unit 530 includes first and second vertical guide rails 531a and 531b extending in the second direction II, and spaced substantially parallel to each other. First vertical driving members 532a and 533a are linearly disposed, and are movable along the first vertical guide rail 531a. Second vertical driving members 532b and 533b are linearly disposed, and are movable along the second vertical guide rail 531b. The first vertical driving member 532a and the second vertical driving member 532b are coupled to both ends of a first horizontal guide rail 534a. A horizontal driving member 535a is linearly disposed, and movable along the first horizontal guide rail 534a, and a first head assembly 536a is coupled to the first horizontal driving member 535a. The first vertical driving member 533a and the second vertical driving member 533b are coupled to both ends of a second horizontal guide rail 534b. A second horizontal driving member 535b is linearly disposed, and movable along the second horizontal guide rail 534b, and a second head assembly 536b is coupled to the second horizontal driving member 535b.

The first head assembly 536a and the second head assembly 536b are linearly moved in the second direction II by the vertical driving members 532a, 533a, 532b, and 533b along the vertical guide rails 531a and 531b. The first head assembly 536a and the second head assembly 536b are linearly moved in the first direction I by the horizontal driving members 535a and 535b along the horizontal guide rails 534a and 534b.

Figure 9:
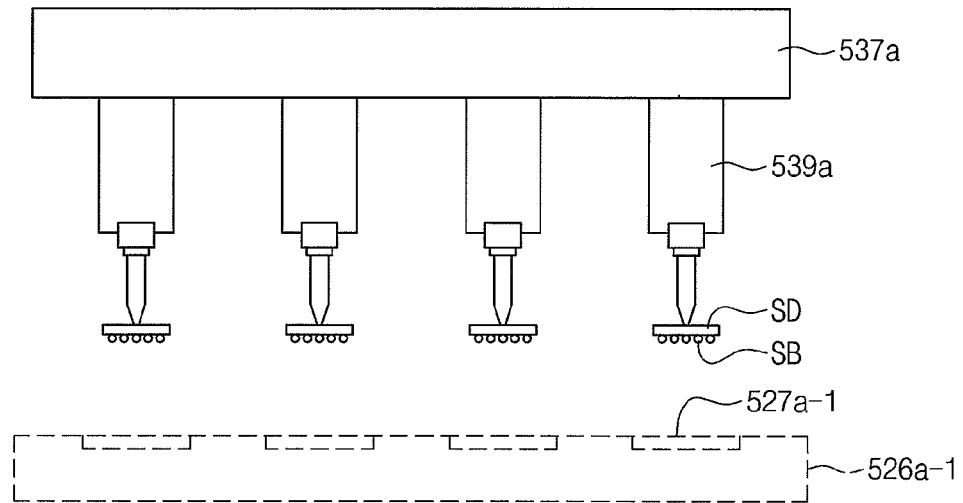
FIG. 9 is a view illustrating a head assembly of FIG. 8 according to an exemplary embodiment of the inventive concept.

Since the first head assembly 536a and the second head assembly 536b have a similar construction, only the first head assembly 536a will be described below. Referring to FIG. 9, the first head assembly 536a includes a bracket 537a coupled to the first horizontal driving member 535a, and a plurality of vacuum absorption heads 539a disposed on the bracket 537a. The vacuum absorption heads 539a vacuum-absorb the semiconductor devices SD received in the receiving grooves 527a-1 and 527a-2 of the trays 526a-1 and 526a-2.

The flux baths 540a and 540b include a first flux bath 540a and a second flux bath 540b. The first flux bath 540a may be disposed at a side of the first circuit board transfer rail 510a, and the second flux bath 540b may be disposed at a side of the second circuit board transfer rail 510b. A flux is deposited into the first and second flux baths 540a and 540b. The solder bumps of the semiconductor devices are submerged in the flux in the first and second flux baths 540a and 540b before the solder bumps are coupled to the connection pads of the circuit board. Coating the flux on the solder bumps removes a surface oxide layer formed on the solder bumps. When the semiconductor devices are mounted on the circuit board, the solder bumps are temporarily coupled to the connection pads by the flux.

The optical detection members 550a and 550b include a first optical detection member 550a and a second optical detection member 550b. The first optical detection member 550a may be disposed at a side of the first circuit board transfer rail 510a, and the second optical detection member 550b may be disposed at a side of the second circuit board transfer rail 510b. The first and second optical detection members 550a and 550b read reference position information of the semiconductor device mounting region on the circuit board transferred by the first and second circuit board transfer rails 510a and 510b, and position information of the solder bumps of the semiconductor device picked up by the first and second head assemblies 536a and 536b. Based on the position information, the solder bumps of the semiconductor device may be aligned with the connection pads of the circuit board.

An operation of the mounting component 20 including the above-described components will now be described in detail.

The circuit board PCB is supplied from the rail 322 of the circuit board supply unit 300 disposed on the loading component 10 to the first circuit board transfer rail 510a. The mounting process is then performed by the first transfer gripper 512a. The circuit board PCB is then supplied from the rail 322 of the circuit board supply unit 300 to the second circuit board transfer rail 510b. The mounting process is then performed by the second transfer gripper 512b. In this manner, the circuit boards PCB are continuously supplied from the circuit board supply unit 300 to the first and second circuit board transfer rails 510a and 510b.

The second transfer component 470a of the first semiconductor device supply unit 400a disposed on the loading component 10 transfers the flipped semiconductor devices to the trays 526a-1 and 526a-2 of the first semiconductor device transfer unit 520a. The semiconductor devices are received into the receiving grooves 527a-1 and 527a-2 of the trays 526a-1 and 526a-2. The linear driving members 524a-1 and 524a-2 move the trays 526a-1 and 526a-2 along the guide members 522a-1 and 522a-2.

The first head assembly 536a is linearly moved in the first direction I along the first horizontal guide rail 534a by the first horizontal driving member 535a, and is linearly moved in the second direction II along the vertical guide rails 531a and 531b by the vertical driving members 532a and 532b. The first head assembly 536a is disposed above the tray 526a-1. The vacuum absorption heads 539a of the first head assembly 536a pick up the semiconductor devices received in the tray 526a-1. The first head assembly 536a is moved above the first flux bath 540a, and the solder bumps of the semiconductor device picked up by the first head assembly 536a are submerged in the flux of the first flux bath 540a.

The first optical detection member 550a reads reference position information of the semiconductor device mounting region on the circuit board transferred by the first circuit board transfer rail 510a, and position information of the solder bumps of the semiconductor devices picked up by the first head assembly 536a. The first head assembly 536a is moved above the circuit board PCB on the first circuit board transfer rail 510a and aligns the solder bumps of the semiconductor device with the connection pads of the circuit board PCB, based on the position information. The first head assembly 536a compresses the semiconductor devices onto the circuit boards PCB, and couples the solder bumps to the connection pads. The solder bumps are temporarily coupled to the connection pads by the flux.

The second transfer component 470b of the second semiconductor device supply unit 400b disposed on the loading component 10 transfers the flipped semiconductor devices to the trays 526b-1 and 526b-2 of the second semiconductor device transfer unit 520b. The semiconductor devices are received into the receiving grooves 527b-1 and 527b-2 of the trays 526b-1 and 526b-2. The trays 526b-1 and 526b-2 are moved along the guide members 522b-1 and 522b-2 by the linear driving members 524b-1 and 524b-2.

The second head assembly 536b is linearly moved in the first direction I along the second horizontal guide rail 534b by the second horizontal driving member 535b, and is linearly moved in the second direction II along the vertical guide rails 531a and 531b by the vertical driving members 533a and 533b. The second head assembly 536b is disposed above the tray 526b-1. The vacuum absorption heads 539b of the second head assembly 536b pick up the semiconductor devices received in the tray 526b-1. The second head assembly 536b is moved above the second flux bath 540b, and the solder bumps of the semiconductor device picked up by the second head assembly 536b are submerged into the flux of the second flux bath 540b.

The second optical detection member 550b reads reference position information of the semiconductor device mounting region on the circuit board transferred by the second circuit board transfer rail 510b, and position information of the solder bumps of the semiconductor devices picked up by the second head assembly 536b. The second head assembly 536b is moved above the circuit board PCB on the second circuit board transfer rail 510b and aligns the solder bumps of the semiconductor device with the connection pads of the circuit board PCB, based on the position information. The second head assembly 536b compresses the semiconductor devices onto the circuit boards PCB, and couples the solder bumps to the connection pads. The solder bumps are temporarily coupled to the connection pads by the flux.

Through the above-described process, the circuit board PCB to which the semiconductor device is temporarily coupled is transferred to the reflowing component 30.

Figure 10:
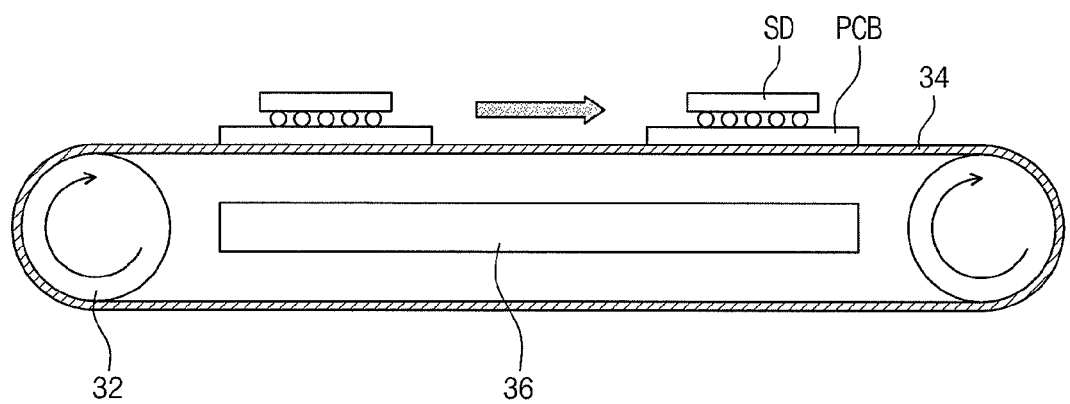
FIG. 10 is a view illustrating a reflowing component of FIG. 1 according to an exemplary embodiment of the inventive concept.

FIG. 10 is a view illustrating the reflowing component 30 of FIG. 1. Referring to FIG. 10, the reflowing component 30 may include a roller 32, a conveyor belt 34 operated by the roller 32, and a heater 36. The circuit board PCB to which the semiconductor device SD is temporarily coupled is transferred onto the conveyor belt 34 by the first and second circuit board transfer rails 510a and 510b. The conveyor belt 34 is operated by the rotation of the roller 32. When the circuit board PCB is transferred in one direction by the operation of the conveyor belt 34, the heater 36 supplies heat to the solder bump to fuse the solder bump. The solder bump SB and the connection pad, which are temporarily coupled to each other, are permanently coupled to each other as a result of the fusion.

Referring again to FIG. 1, once the reflowing process is performed in the reflowing component 30, the semiconductor device and the circuit board are unloaded to the unloading component 40. The unloading component 40 may include a transfer robot 42 and a vessel 44. The transfer robot 42 transfers the circuit board to which the semiconductor devices are coupled from the reflowing component 30 to the vessel 44.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. An apparatus for mounting a semiconductor device, comprising:
   a mounting component configured to mount the semiconductor device onto a circuit board; and
   a loading component disposed adjacent to the mounting component, and configured to supply the semiconductor device and the circuit board to the mounting component,
   wherein the loading component comprises a semiconductor device supply unit configured to supply the semiconductor device to the mounting component,
   wherein the semiconductor device supply unit comprises:
      a wafer cassette comprising a plurality of slots, wherein the slots of the wafer cassette are configured to receive a plurality of wafers, each wafer includes a plurality of semiconductor devices, and the semiconductor device is one of the plurality of semiconductor devices;
      a tape expander configured to expand an ultraviolet tape disposed on a back side of each of the wafers; and
      a transfer component configured to transfer each of the plurality of semiconductor devices from each of the wafers to the mounting component,
   wherein the loading component further comprises:
      a circuit board loading unit configured to load the circuit board into the loading component; and
      a circuit board supply unit configured to supply the circuit board to the mounting component,
   wherein the semiconductor device supply unit, the circuit board loading unit, and the circuit board supply unit are disposed within a single housing,
   wherein the circuit board loading unit comprises:
      a magazine comprising a plurality of slots, wherein the slots of the magazine are configured to receive a first plurality of circuit boards;
      a first robot configured to eject one of the first plurality of circuit boards from the magazine;
      a substrate cassette configured to receive a second plurality of circuit boards, wherein the substrate cassette includes an opening on an upper side, and the second plurality of circuit boards are vertically stacked within the substrate cassette;
      a second robot configured to eject one of the second plurality of circuit boards from the substrate cassette; and
      a conveyor configured to transfer one of the first plurality of circuit boards from the magazine or one of the second plurality of circuit boards from the substrate cassette to the circuit board supply unit.

2. The apparatus of claim 1, wherein the circuit board loading unit further comprises a controller configured to load a circuit board from one of the magazine or the substrate cassette into the loading component.

3. The apparatus of claim 1, wherein the loading component further comprises a reject mark detector disposed above the conveyor, wherein the reject mark detector is configured to read a reject mark formed on the circuit board transferred by the conveyor, and the reject mark indicates whether a semiconductor device mounting region on the circuit board is defective.

4. The apparatus of claim 1, wherein the circuit board supply unit comprises:
   a feeder disposed adjacent to the conveyor, wherein the feeder is configured to receive the circuit board transferred by the conveyor, and move the circuit board in a first direction; and
   a feeder driving member configured to move the feeder in a second direction, substantially perpendicular to the first direction, and stop the feeder in a plurality of positions.

5. The apparatus of claim 4, wherein the circuit board loading unit and the circuit board supply unit are arranged along the first direction in a central region of the housing, and the semiconductor device supply unit includes the semiconductor device supply unit disposed on a first side of the circuit board loading unit and the circuit board supply unit along the second direction, and an additional semiconductor device supply unit disposed on a second, opposing side of the circuit board loading unit and the circuit board supply unit along the second direction.

6. An apparatus for mounting a semiconductor device, comprising:
   a mounting component configured to mount the semiconductor device onto a circuit board; and
   a loading component disposed adjacent to the mounting component, and configured to supply the semiconductor device and the circuit board to the mounting component,
   wherein the loading component comprises:
      a semiconductor device supply unit configured to supply the semiconductor device to the mounting component;
      a circuit board loading unit configured to load the circuit board into the loading component; and
      a circuit board supply unit configured to supply the circuit board to the mounting component,
   wherein the semiconductor device supply unit, the circuit board loading unit, and the circuit board supply unit are disposed within a single housing,
   wherein the circuit board loading unit comprises:
      a magazine comprising a plurality of slots, wherein the slots of the magazine are configured to receive a first plurality of circuit boards;
      a first robot configured to eject one of the first plurality of circuit boards from the magazine;

a substrate cassette configured to receive a second plurality of circuit boards,
wherein the substrate cassette includes an opening on an upper side, and the second plurality of circuit boards are vertically stacked within the substrate cassette;
a second robot configured to eject one of the second plurality of circuit boards from the substrate cassette; and
a conveyor configured to transfer one of the first plurality of circuit boards from the magazine or one of the second plurality of circuit boards from the substrate cassette to the circuit board supply unit,
wherein the circuit board supply unit comprises:
a feeder disposed adjacent to the conveyor, wherein the feeder is configured to receive the circuit board transferred by the conveyor, and move the circuit board in a first direction; and
a feeder driving member configured to move the feeder in a second direction, substantially perpendicular to the first direction, and stop the feeder in a plurality of positions,
wherein the circuit board loading unit and the circuit board supply unit are arranged along the first direction in a central region of the housing, and the semiconductor device supply unit includes a first semiconductor device supply unit disposed on a first side of the circuit board loading unit and the circuit board supply unit along the second direction, and a second semiconductor device supply unit disposed on a second, opposing side of the circuit board loading unit and the circuit board supply unit along the second direction,
wherein each of the first and second semiconductor device supply units comprises:
a wafer cassette comprising a plurality of slots, wherein the slots of the wafer cassette are configured to receive a plurality of wafers, each wafer includes a plurality of semiconductor devices, and the semiconductor device is one of the plurality of semiconductor devices;
a tape expander configured to expand an ultraviolet tape disposed on a back side of each of the wafers; and
a transfer component configured to transfer each of the plurality of semiconductor devices from each of the wafers to the mounting component.

7. The apparatus of claim 6, wherein the transfer component is configured to flip over each of the semiconductor devices.

8. The apparatus of claim 6, wherein the mounting component comprises:
a first circuit board transfer rail and a second circuit board transfer rail extending in the first direction, wherein the first and second circuit board transfer rails are configured to move the circuit board transferred from the feeder in the first direction;
a first semiconductor device transfer unit disposed on a first side of the first and second circuit board transfer rails in the second direction, and a second semiconductor device transfer unit disposed on a second, opposing side of the first and second circuit board transfer rails along the second direction, wherein the first and second semiconductor device transfer units are configured to move the semiconductor device transferred from the transfer component in the first direction; and
a first head assembly and a second head assembly configured to pick up and mount the semiconductor device on the circuit board.

9. The apparatus of claim 8, wherein each of the first and second semiconductor device transfer units comprises:
a plurality of guide members disposed substantially parallel to each other and extending along the first direction;
a plurality of linear driving members disposed on the guide members, and configured to move along the guide members in the first direction; and
a plurality of trays disposed on the linear driving members, and configured to receive the semiconductor device transferred from the transfer component.

10. The apparatus of claim 9, wherein the plurality of trays comprise a plurality of receiving grooves configured to receive the semiconductor device.

11. The apparatus of claim 10, wherein each of the first and second head assemblies comprises a plurality of heads configured to vacuum-absorb the semiconductor device received in the receiving grooves of the plurality of trays.

12. An apparatus for mounting a semiconductor device, comprising:
a mounting component configured to mount the semiconductor device onto a circuit board; and
a loading component disposed adjacent to the mounting component along a first direction, configured to supply the semiconductor device and the circuit board to the mounting component, wherein the loading component comprises:
a first semiconductor device supply unit and a second semiconductor device supply unit disposed along a second direction, substantially perpendicular to the first direction, wherein the first and second semiconductor device supply units are spaced apart from each other and are configured to supply the semiconductor device to the mounting component;
a circuit board loading unit disposed between the first and second semiconductor device supply units, and configured to load the circuit board into the loading component; and
a circuit board supply unit disposed between the first and second semiconductor device supply units and adjacent to the circuit board loading unit, and configured to supply the circuit board to the mounting component,
wherein each of the first and second semiconductor device supply units comprises:
a wafer cassette comprising a plurality of slots, wherein the slots of the wafer cassette are configured to receive a plurality of wafers, each wafer includes a plurality of semiconductor devices, and the semiconductor device is one of the plurality of semiconductor devices;
a tape expander configured to expand an ultraviolet tape disposed on a back side of each of the wafers; and
a transfer component configured to transfer each of the plurality of semiconductor devices from each of the wafers to the mounting component.

13. The apparatus of claim 12, wherein the circuit board loading unit comprises:
a magazine comprising a plurality of slots, a front side, and a rear side, wherein the plurality of slots of the magazine are configured to receive the circuit board, the front and rear sides each include an opening, and the front and rear sides are disposed along the first direction;
a conveyor disposed adjacent to the rear side of the magazine, and configured to transfer the circuit board to the circuit board supply unit;
a first robot configured to eject the circuit board from the magazine and onto the conveyor;

a substrate cassette disposed at a side of the conveyor, wherein the substrate cassette includes an opening on an upper side, and a plurality of circuit boards are vertically stacked within the substrate cassette; and a second robot configured to eject one of the plurality of circuit boards from the substrate cassette and onto the conveyor.

14. The apparatus of claim 13, wherein the loading component further comprises a reject mark detector disposed above the conveyor, wherein the reject mark detector is configured to read a reject mark formed on the circuit board transferred by the conveyor, and the reject mark indicates whether a semiconductor device mounting region on the circuit board is defective.

15. The apparatus of claim 13, wherein the circuit board supply unit comprises:
   a feeder configured to receive the circuit board transferred by the conveyor, and move the circuit board in the first direction; and
   a feeder driving member configured to move the feeder in the second direction,
   wherein the feeder driver is configured to stop the feeder in a first position corresponding to a first circuit board transfer rail in the mounting component, and a second position corresponding to a second circuit board transfer rail in the mounting component, wherein the first and second circuit board transfer rails are configured to move the circuit board transferred by the feeder in the first direction.

16. The apparatus of claim 15, wherein the mounting component comprises:
   a first semiconductor device transfer unit disposed on a first side of the first and second circuit board transfer rails in the second direction, and a second semiconductor device transfer unit disposed on a second, opposing side of the first and second circuit board transfer rails in the second direction, wherein the first and second semiconductor device transfer units are configured to receive the plurality of semiconductor devices from the transfer component, and move the semiconductor devices in the first direction; and
   a first head assembly and a second head assembly configured to pick up the plurality of semiconductor devices from the first and second semiconductor device transfer units.

* * * * *